United States Patent [19]
Hudson

[11] Patent Number: 5,972,792
[45] Date of Patent: Oct. 26, 1999

[54] METHOD FOR CHEMICAL-MECHANICAL PLANARIZATION OF A SUBSTRATE ON A FIXED-ABRASIVE POLISHING PAD

[75] Inventor: Guy F. Hudson, Boise, Id.

[73] Assignee: Micron Technology, Inc., Boise, Id.

[21] Appl. No.: 08/732,691

[22] Filed: Oct. 18, 1996

[51] Int. Cl.⁶ ............................................... H01L 21/302
[52] U.S. Cl. ..................... 438/691; 438/633; 438/692; 216/88; 216/100
[58] Field of Search ................................ 216/52, 53, 88, 216/90, 91, 100; 438/691, 692, 633, 747, 759; 451/41, 287, 532, 539, 921

[56] References Cited

U.S. PATENT DOCUMENTS

| | | | |
|---|---|---|---|
| 3,638,366 | 2/1972 | Gamache | 51/326 |
| 3,957,553 | 5/1976 | Smith | 156/22 |
| 4,879,258 | 11/1989 | Fisher | 437/225 |
| 4,903,440 | 2/1990 | Larson et al. | 51/298 |
| 4,910,155 | 3/1990 | Cote et al. | 437/8 |
| 4,927,432 | 5/1990 | Budinger et al. | 51/298 |
| 4,954,141 | 9/1990 | Takiyama et al. | 51/296 |
| 4,954,142 | 9/1990 | Carr et al. | 51/309 |
| 4,992,135 | 2/1991 | Doan | 216/88 |
| 5,209,816 | 5/1993 | Yu et al. | 156/636 |
| 5,262,354 | 11/1993 | Cote et al. | 216/88 |
| 5,300,155 | 4/1994 | Sandhu et al. | 148/33 |
| 5,318,927 | 6/1994 | Sandhu et al. | 437/225 |
| 5,335,453 | 8/1994 | Baldy et al. | 51/67 |
| 5,340,370 | 8/1994 | Cadien et al. | 216/89 |
| 5,354,490 | 10/1994 | Yu et al. | 252/79.1 |
| 5,391,258 | 2/1995 | Brancaleoni et al. | 216/89 |
| 5,392,950 | 2/1995 | Rutherford et al. | 451/552 |
| 5,453,312 | 9/1995 | Haas et al. | 428/143 |
| 5,482,497 | 1/1996 | Gonnella et al. | 451/57 |
| 5,575,885 | 11/1996 | Hirabayashi et al. | 216/38 |
| 5,578,362 | 11/1996 | Reinhardt et al. | 428/147 |
| 5,578,523 | 11/1996 | Fiordalice et al. | 438/672 |
| 5,624,303 | 4/1997 | Robinson | 451/295 |
| 5,643,044 | 7/1997 | Lund | 451/5 |
| 5,707,492 | 1/1998 | Stager et al. | 156/645.1 |
| 5,759,427 | 6/1998 | Cibulsky et al. | 216/91 |

FOREIGN PATENT DOCUMENTS

| | | |
|---|---|---|
| 685299 A1 | 12/1995 | European Pat. Off. . |
| 0708160A2 | 4/1996 | European Pat. Off. . |
| 8-064562 | 3/1996 | Japan . |
| 08-112740 | 5/1996 | Japan . |
| WO 96/16436 | 5/1996 | WIPO . |

OTHER PUBLICATIONS

Uematsu, T. et al "Efficient mechanochemical polishing for silicon nitride ceramics" NIST Spec. Publ. 847 (Machining of Advanced Materials), pp. 409–413, 1993.

*Primary Examiner*—Bruce Breneman
*Assistant Examiner*—Anita Alanko
*Attorney, Agent, or Firm*—Seed and Berry, LLP

[57] ABSTRACT

A method for chemical-mechanical planarization of a substrate on a fixed-abrasive polishing pad in which a planarizing solution is dispensed onto the fixed-abrasive polishing pad. The planarizing solution is preferably an abrasive-free planarizing solution that oxidizes a surface layer on the substrate without passing the surface layer into solution, and the fixed-abrasive pad has a substantially uniform distribution of abrasive particles fixedly bonded to a suspension medium. The surface layer of the substrate is then pressed against the fixed-abrasive pad in the presence of planarizing solution, and at least one of the fixed-abrasive pad or the substrate moves relative to the other to remove material from the surface of the substrate. In operation, the planarizing solution forms a rough, scabrous layer of non-soluble oxides on the surface layer that are readily removed by the abrasive surface of the polishing pad. In one embodiment of the invention, the pH of the planarizing solution is controlled to oxidize the material of the surface layer without passing it into solution.

38 Claims, 2 Drawing Sheets

METHOD FOR CHEMICAL-MECHANICAL PLANARIZATION OF A SUBSTRATE ON A FIXED-ABRASIVE POLISHING PAD

TECHNICAL FIELD

The present invention relates to chemical-mechanical planarization of substrates, and more particularly to planarizing substrates with fixed-abrasive polishing pads.

BACKGROUND OF THE INVENTION

Chemical-mechanical planarization ("CMP") processes remove material from the surface of a wafer or other substrate in the production of semiconductor devices. FIG. 1 schematically illustrates a CMP machine 10 with a platen 20, a wafer carrier 30, a polishing pad 40, and a planarization liquid 44 on the polishing pad 40. The polishing pad may be a conventional polishing pad made from a non-abrasive material (e.g., polyurethane), or it may be a new generation fixed-abrasive polishing pad made from abrasive particles fixedly dispersed in a suspension medium. The planarization liquid may be a conventional CMP slurry with abrasive particles and chemicals that remove material from the surface of the wafer, or it may be a solution without abrasive particles. In most CMP applications, conventional CMP slurries with abrasive particles are used on conventional polishing pads, and planarizing liquids without abrasive particles are used on fixed-abrasive polishing pads.

The CMP machine 10 also has an under-pad 25 attached to an upper surface 22 of the platen 20 and the lower surface of the polishing pad 40. In one type of CMP machine, a drive assembly 26 rotates the platen 20 as indicated by arrow A. In another type of CMP machine, the drive assembly reciprocates that platen back and forth as indicated by arrow B. Because the polishing pad 40 is attached to the under-pad 25, the polishing pad 40 moves with the platen.

The wafer carrier 30 has a lower surface 32 to which a wafer 12 may be attached, or the wafer 12 may be attached to a resilient pad 34 positioned between the wafer 12 and the wafer carrier 30. The wafer carrier 30 may be a weighted, free-floating wafer carrier or an actuator assembly 36 may be attached to the wafer carrier 30 to impart axial motion, rotational motion, or a combination of axial and rotational motion (indicated by arrows C and D, respectively).

To planarize the wafer 12 with the CMP machine 10, the wafer carrier 30 presses the wafer 12 face-downward against the polishing pad 40. While the face of the wafer 12 presses against the polishing pad 40, at least one of the platen 20 or the wafer carrier 30 moves relative to the other to move the wafer 12 across the planarizing surface 42. As the face of the wafer 12 moves across the planarizing surface 42, the polishing pad 40 and the planarizing solution 44 continually remove material from the face of the wafer.

One objective of CMP processing is to produce a uniformly planar surface on the semiconductor wafers. The uniformity of the planarized surface is a function of several factors, one of which is the distribution of abrasive particles between the wafer and the polishing pad. Fixed-abrasive polishing pads provide a substantially uniform distribution of particles between the wafer and the polishing pad because the abrasive particles are fixedly dispersed in the pad. CMP slurries with abrasive particles, however, may not provide a uniform distribution of particles because the slurry builds up at the perimeter of the wafer leaving less slurry under other parts of the wafer. Thus, it is desirable to use fixed-abrasive polishing pads.

One problem with using fixed-abrasive polishing pads to remove material from the surface of the wafer is that the fixed-abrasive pads tend to have a relatively low polishing rate compared to conventional pads and slurries. Fixed-abrasive pads are often used without a slurry because conventional planarization slurries with abrasive particles damage the planarizing surface of fixed-abrasive polishing pads. For example, when a wafer is planarized on a fixed-abrasive pad with a conventional abrasive slurry, the abrasive particles in the slurry generally damage the abrasive particles of the polished pad. Thus, it would be desirable to increase the polishing rate of fixed-abrasive pad CMP without damaging the fixed-abrasive pad.

Another problem with fixed-abrasive pad CMP is that defects may accidentally form on the surface of the wafer. As material is removed from the wafer, abrasive particles and other parts of the fixed-abrasive polishing pad may break away and become trapped between the surface of the wafer and the fixed-abrasive polishing pad. When the fixed-abrasive pad is used without a slurry, the detached pieces of the fixed-abrasive polishing pad often scratch the wafer and may damage several die on the wafer. Therefore, it would also be desirable to reduce defects caused by fixed-abrasive polishing pads.

SUMMARY OF THE INVENTION

The inventive CMP process preferably increases the polishing rate and reduces defects in fixed-abrasive pad CMP. In an embodiment of the invention for planarizing a metal surface layer on a substrate, an abrasive-free planarizing solution is dispensed onto a fixed-abrasive polishing pad. The abrasive-free planarizing solution preferably has an oxidant that oxidizes the metal on the surface of the substrate without passing the metal into solution. The fixed-abrasive pad has a suspension medium and a substantially uniform distribution of abrasive particles fixedly bonded to the suspension medium. The surface layer of the substrate is then pressed against the fixed-abrasive pad in the presence of the planarizing solution, and at least one of the fixed-abrasive pad or the substrate moves relative to the other. In operation, the planarizing solution forms a rough, scabrous layer of non-soluble oxides on the surface layer that is removed by the abrasive particles of the polishing pad. The non-soluble oxides are generally easier to detach from the substrate with mechanical force than the non-oxidized material.

In one embodiment of the invention, the planarizing solution has an oxidant, and the pH of the planarizing solution is controlled to oxidize the material of the surface layer without passing it into solution. In another embodiment of the invention, the surface layer on the substrate or wafer is a chalcogenide material that oxidizes in the presence of air. The planarizing solution for chalcogenide materials accordingly has a pH that does not dissolve the chalcogenide material.

The inventive CMP process may be used to form electrically isolated conductive features on a semiconductor wafer by depositing an upper layer of conductive material onto a top surface of an insulating layer and into depressions in the insulating layer. A portion of the upper conductive layer is removed with the inventive CMP process until the insulating layer is exposed between the depressions in the insulating layer. More specifically, the upper conductive layer is preferably removed by dispensing an abrasive-free, oxidizing planarizing solution onto a fixed-abrasive pad; pressing the upper conductive layer against the fixed-abrasive pad in the presence of the planarizing solution; and moving the upper conductive layer and the fixed-abrasive pad relative to each other. The remaining portions of the upper conductive layer in the depressions of the insulating layer form electrically isolated conductive features.

DETAILED DESCRIPTION OF THE INVENTION

The present invention is a method for quickly planarizing a surface layer on a semiconductor wafer or other substrate with a fixed-abrasive polishing pad. An important aspect of an embodiment of the invention is to planarize the surface layer on a fixed-abrasive polishing pad covered with an abrasive-free planarizing solution that oxidizes and/or roughens the material of the surface layer without dissolving the material of the surface layer. The thin, roughened layer on the wafer is readily removed by the abrasive particles in the fixed-abrasive polishing pad, which increases the polishing rate of fixed-abrasive pad CMP. The method of the invention, therefore, increases the throughput of CMP processes using fixed-abrasive pads.

Figure 1:
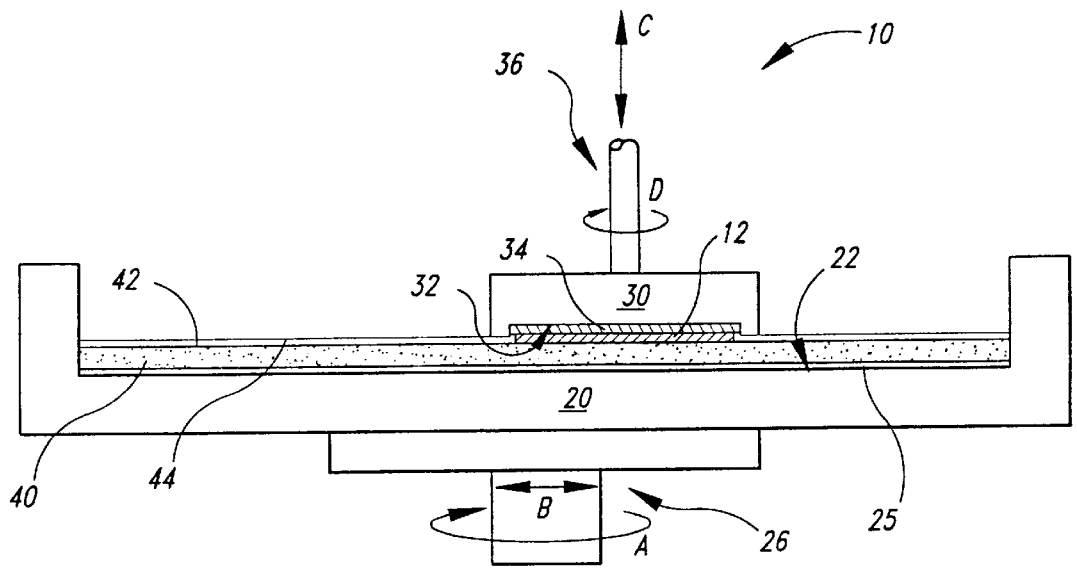
FIG. 1 is a schematic cross-sectional view of a chemical-mechanical planarizing machine in accordance with the prior art.
Figure 2:
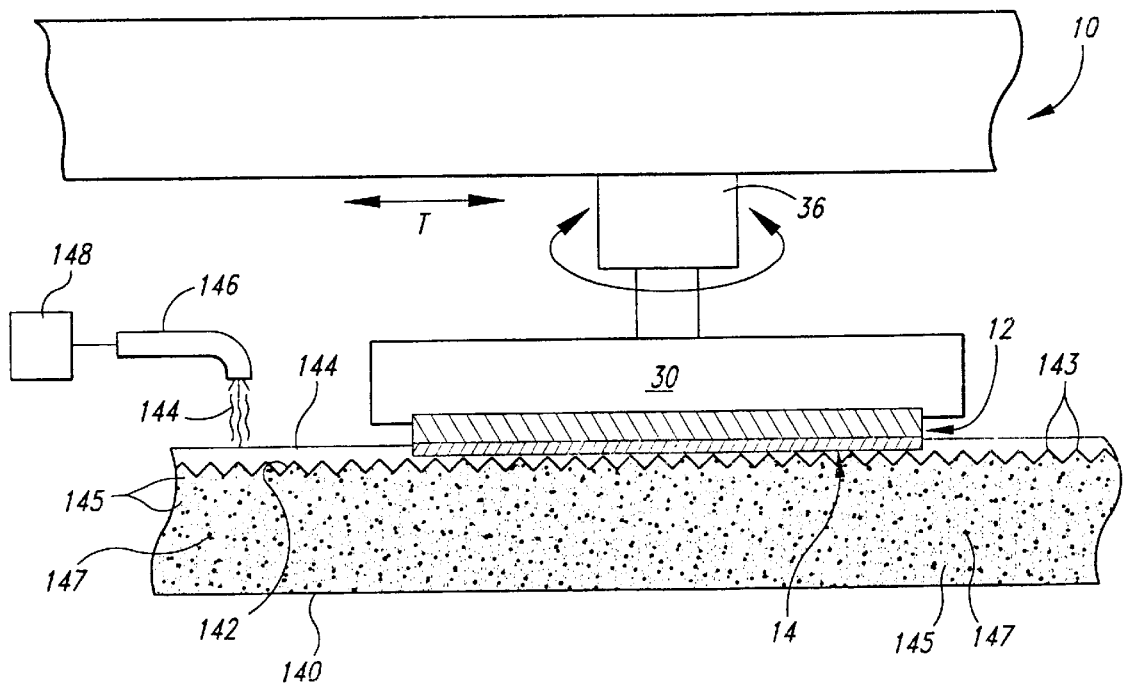
FIG. 2 is a partial schematic cross-sectional view of a substrate being planarized in accordance with an embodiment of a method of the invention.

FIG. 2 is a schematic cross-sectional view of a wafer 12 being planarized on a CMP machine 10 in accordance with an embodiment of a method of the invention. The wafer 12 is mounted to a wafer carrier 30 and pressed against a planarizing surface 142 of a fixed-abrasive polishing pad 140 coated with a planarizing solution 144. The planarizing solution 144 is preferably dispersed onto the fixed-abrasive polishing pad 140 through a dispenser 146 positioned over the polishing pad and operatively connected to a supply 148 of planarizing solution 144. The planarizing solution 144 oxidizes, roughens, or otherwise interacts with the material of the surface layer at the front face 14 of the wafer 12 to form a thin layer on the wafer that is easily removed by mechanical force. The fixed-abrasive pad 140 preferably has a suspension medium 145 and a plurality of abrasive particles 147 fixedly dispersed in the suspension medium 145. The planarizing surface 142 preferably has a number of raised features 143 formed thereon to further abrade the wafer 12.

To planarize the wafer 12, the wafer carrier 30 and/or the fixed-abrasive pad 140 move relative to one another while the wafer 12 is pressed against the planarizing surface 142 of the fixed-abrasive pad 140. As the front face 14 of the wafer 12 moves across the planarizing surface 142 of the fixed-abrasive pad 140, the abrasive particles 147 abrade the thin, oxidized layer (not shown) on the front face 14 of the wafer 12 to remove material from the wafer 12. As explained in detail below, the abrasive particles 147 remove the oxidized or otherwise roughened surface of the front face 14 of the wafer 12 faster than non-oxidized material.

The planarizing solution 144 preferably forms an oxide with the material at the surface of the front face 14 of the wafer 12 without dissolving the material. When the front face 14 of the wafer 12 is a metal that does not oxidize in the presence of air without the assistance of a catalyst, the planarizing solution is preferably a liquid with an oxidant that causes the particular metal to react with oxygen and form an oxide. The specific oxidants in the planarizing solution 144, therefore, depend upon the material of the surface layer at the front face 14 of the wafer 12. To form an oxide with the material at the surface of the front face 14 of the wafer 12 without dissolving the material, the planarizing solution typically has an oxidant in a pH-controlled solution. Accordingly, the particular planarizing solution preferably has a pH that reacts with the material at the front face 14 of the wafer 12 without passing the material into solution. When the material at the front face 14 of the wafer 12 is a chalcogenide (forms a native oxide in the presence of air), the planarizing solution may consist of virtually any liquid that does not pass the chalcogenide material into solution.

The material at the front-face of the wafer may be a single layer of material or a multi-level film stack with several layers of material. For example, the material at the front-face of the wafer may be a multi-level film stack with different metals (e.g., titanium and aluminum on a tungsten plug) and a barrier layer (e.g., titanium nitride). The planarizing solution 144 forms an oxide with at least some of the layers of a multi-level film stack, and preferably with all of the layers of a multi-level film stack. Thus, the present invention preferably applies to planarization of single-level and multi-level film formations.

The present invention is particularly useful for planarizing metal layers from the front face 14 of the wafer 12 to form conductive features such as damascene lines and interlayer plugs. To planarize a conductive layer of tungsten from the wafer 12, the planarizing solution preferably has a pH below 5.0 and contains at least one of the following oxidants: ferric nitrate, hydrogen peroxide, potassium iodate, and bromine. In a specific example, a layer of tungsten may be quickly planarized with a silica-ceria fixed-abrasive polishing pad and a particle-free potassium iodate planarizing solution at a pH of 4.5. One suitable planarizing solution is a modified QCTT1011-14B potassium iodate planarizing solution manufactured by Rodel Corporation of Newark, Del. The QCTT1011-14B solution is a conventional slurry with abrasive particles that has been used only on conventional, non-abrasive polishing pads. To modify the QCTT1101-14B solution for use in the present invention, the abrasive particles are removed to form an abrasive-free solution and the solution is used on a fixed-abrasive pad.

The method of the invention may also be used to planarize other materials including, but not limited to, aluminum and copper. To planarize a conductive layer of aluminum from the front face 14 of the wafer 12, the planarizing solution preferably has a pH of between approximately 3.0 and 10.0, and includes one of the following oxidants: hydrogen peroxide, potassium iodate, or ferric nitrate. To planarize a conductive layer of copper from the front face 14 of the wafer 12, the planarizing solution preferably has a pH of less than approximately 2.5 or more than approximately 10.5, and has one of the following mixtures: deionized water with 0.1%–5.0% nitric acid and 0.1%–10.0% ethanol; deionized water with 0.1%–5.0% nitric acid and 0.1%–1.0% benzotriazole; deionized water with 0.5%–3.0% ammonium hydroxide; or deionized water with 0.5%–3.0% ammonia ferricyanide.

Figure 3:
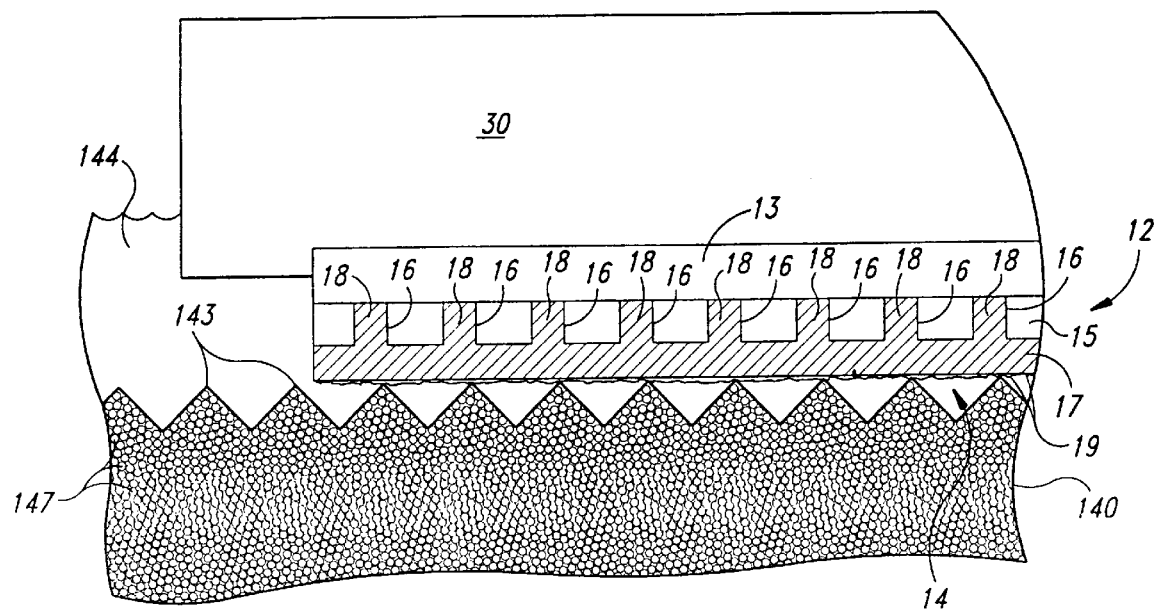
FIG. 3 is a partial schematic cross-sectional view of a semiconductor wafer at one point in an embodiment of a method for making conductive features in accordance with the invention.

FIG. 3 illustrates electrically isolated conductive features being formed on the wafer 12 by an embodiment of the method of the invention. The wafer 12 generally has a substrate 13, an insulating layer 15 with depressions or vias 16, and an upper conductive layer 17 deposited over the insulating layer 15 and into the vias 16. The material of the upper conductive layer 17 fills the vias 16 to form contact plugs 18. Several layers of insulating, semi-insulating, semi-conducting, and conducting layers may be deposited on the wafer 12 between the substrate 13 and the upper conductive layer 17. The upper conductive layer 17 may be made from many conductive materials including, but not limited to, tungsten, aluminum, or polysilicon.

To form electrically isolated features on the wafer 12, the wafer 12 is mounted to the wafer carrier 30 and a planarizing solution 144 in accordance with the invention is deposited onto the fixed-abrasive polishing pad 140. As discussed above with respect to FIG. 2, the planarizing solution does not contain abrasive particles and it preferably oxidizes the material of the upper conductive layer 17 without passing the material of the upper conductive layer 17 into solution. The wafer carrier 30 subsequently presses the wafer 12 against the raised features 143 of the fixed-abrasive polishing pad 140. Since the planarizing solution 144 oxidizes the material of the upper conductive layer 17, the planarizing solution 144 forms a thin, scabrous layer 19 across the front face 14 of the wafer 12. The scabrous layer 19 preferably has a rough surface with relatively brittle features compared to the surface of non-oxidized material of the upper conductive layer 17.

After the wafer 12 is pressed against the fixed-abrasive polishing pad 140, at least one of the wafer 12 or the fixed-abrasive polishing pad 140 moves relative to the other so that the raised features 143 of the fixed-abrasive polishing pad 140 scrape across the scabrous layer 19 of the wafer 12. The abrasive particles 147 in the fixed-abrasive polishing pad 140 break the rough, brittle features of the scabrous surface 19 away from the remaining portion of the upper conductive layer 17. The planarizing solution 144 continuously oxidizes the newly exposed portions of the upper conductive layer 17 to continuously form a scabrous layer 19 across the surface of the upper conductive layer 17.

Figure 4:
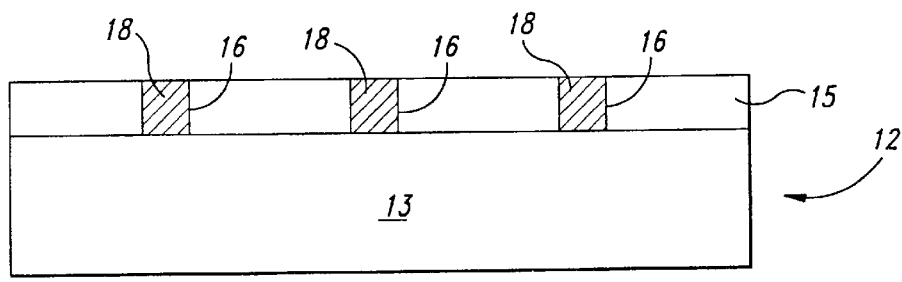
FIG. 4 is a partial schematic cross-sectional view of the semiconductor wafer of FIG. 3 at another point in a method for making conductive features in accordance with the invention.

FIG. 4 illustrates the wafer 12 after it has been planarized by an embodiment of the chemical-mechanical planarization method of the invention. The wafer is planarized until the contiguous portion of the upper conductive layer 17 is removed so that the insulating layer 15 electrically isolates the conductive plugs 18 in the vias 16. In a preferred embodiment, the planarizing solution 144 is selective to the material of the conductive layer 17 by using chemicals that oxidize the material of the conductive layer 17 without oxidizing or dissolving the material of the insulating layer 15. By using a planarizing solution selective to the material of the conductive layer 17, the insulating layer 15 may act as a polish-stop layer to enhance the accuracy of endpointing the CMP process.

Additionally, since the planarizing solution 144 oxidizes the material of the conductive layer without passing it into solution, the top surface of the contact plugs 18 is substantially flush with the top surface of the insulating layer 15. This is in contrast to slurries and planarizing solutions that dissolve the material of the conductive layer 17. When slurries dissolve the conductive layer 17, they effectively etch the conductive layer 17 and cause the top surface of the contact plugs 18 to be below the top surface of the insulating layer 15. Therefore, unlike CMP methods using planarizing solutions and slurries that etch the material of the conductive layer, the method of the preferred embodiment of the invention generally produces a uniformly planar surface even at the micro level between the contact plugs 18 and the conductive layer 15.

One advantage of the preferred embodiment of the present invention is that it enhances the throughput of wafers planarized with fixed-abrasive polishing pads without sacrificing the planarity of the wafers. Unlike slurries that dissolve the material of the surface layer, the present invention uses an abrasive-free planarizing solution that oxidizes the material of the surface layer without passing it into solution. As discussed above, the abrasive particles in the fixed-abrasive polishing pad remove scabrous, oxidized material faster than non-oxidized material. Additionally, because the planarizing solution merely oxidizes the material of the surface layer without passing it into solution, the top surface of conductive features are not etched below the top surface of an insulating layer. Therefore, the method of the invention increases throughput and produces highly planar surfaces.

Another advantage of the preferred embodiment of the present invention is that the fixed-abrasive pad is not damaged by the planarizing solution. Conventional slurries with abrasive particles wear down fixed-abrasive pads, and thus they reduce the effectiveness and the useful life of fixed-abrasive pads. The planarizing solution used in accordance with the method of the invention, however, preferably does not contain abrasive particles or chemicals that otherwise damage the fixed-abrasive pads. Thus, the planarizing solution used in accordance with the method of the invention preferably does not damage or otherwise reduce the useful life of fixed-abrasive pads.

Still another advantage of the preferred embodiment of the present invention is that it reduces the number of defects on wafers planarized with a fixed-abrasive polishing pad. Since conventional slurries with abrasive particles quickly wear down fixed-abrasive polishing pads, many fixed-abrasive pad CMP processes planarize wafers without a solution. However, as discussed above, particles may break away from the fixed-abrasive pads and scratch the surface of the wafer. The planarizing solution used in accordance with the method of the invention preferably reduces defects by providing a liquid buffer between a wafer and a fixed-abrasive polishing pad to carry away small particles that may otherwise scratch the surface of the wafer. Therefore, the planarizing solution used in accordance with the method of the preferred embodiment of the invention reduces the number of defects on the surface of the wafer.

Still another advantage of the preferred embodiment of the present invention is that it enhances the selectivity in planarizing one material with respect to another. CMP processes that planarize a wafer on a fixed-abrasive polishing pad without a planarizing solution are not selective to a specific type of material because they do not rely on chemical reactions to remove material from the surface of the wafer. The preferred embodiment of the present invention, however, may provide selective planarization because the planarizing solution may be formulated to chemically react with one material differently than another material. Therefore, the present invention preferably enhances the ability to control the removal of a material on specific semiconductor wafer structures.

From the foregoing it will be appreciated that, although specific embodiments of the invention have been described herein for purposes of illustration, various modifications may be made without deviating from the spirit and scope of the invention. Also, even though the preferred embodiment of the invention has been described using a substantially abrasive-free planarizing solution to planarize a semiconductor wafer, it will be appreciated that abrasive particles may be used in the planarizing solution to alter the abrasiveness of the fixed abrasive polishing pad or the planarizing process. Additionally, the preferred embodiment of the invention may be used to planarize other substrates, such as baseplates for field emission displays. Accordingly, the invention is not limited except as by the appended claims.

I claim:

1. A chemical-mechanical planarization method for removing material from a metal surface of a microelectronic substrate, comprising:

providing a substantially abrasive-free planarizing solution having a chemical that oxidizes the material at the surface without passing the material into solution by maintaining a pH of the planarizing solution not greater than 5.0;

providing a fixed-abrasive pad having abrasive particles dispersed in a suspension medium, the fixed-abrasive particles being fixedly attached to the suspension medium;

dispensing the planarizing solution onto the fixed-abrasive pad;

pressing the surface of the substrate against the fixed-abrasive pad in the presence of the planarizing solution, wherein the planarizing solution forms non-soluble oxides on the surface of the substrate; and moving at least one of the substrate and the fixed-abrasive pad relative to the other, the fixed-abrasive pad removing the non-soluble oxides from the substrate.

2. The method of claim 1 wherein the surface comprises tungsten, and wherein the step of providing an abrasive-free planarizing solution comprises maintaining the pH of the solution between approximately 4.0 and 5.0.

3. A chemical-mechanical planarizing method for removing material from a copper surface of a microelectronic substrate assembly, comprising:

providing a substantially abrasive-free planarizing solution having a chemical that oxidizes the material at the surface without passing the material into solution by maintaining a pH of the planarizing solution either less than approximately 2.5 or more than 10.5;

providing a fixed-abrasive pad having abrasive particles dispersed in a suspension medium, the fixed-abrasive particles being fixedly attached to the suspension medium;

dispensing the planarizing solution onto the fixed-abrasive pad;

pressing the surface of the substrate against the fixed-abrasive pad in the presence of the planarizing solution, wherein the planarizing solution forms non-soluble oxides on the surface of the substrate; and moving at least one of the substrate and the fixed-abrasive pad relative to the other, the fixed-abrasive pad removing the non-soluble oxides from the substrate.

4. A chemical-mechanical planarizing method for removing material from an aluminum surface of a microelectronic substrate assembly, comprising:

providing a substantially abrasive-free planarizing solution having a chemical that oxidizes the material at the surface without passing the material into solution by combining deionized water with another oxidant and maintaining a pH of the planarizing solution between 3 and 10;

providing a fixed-abrasive pad having abrasive particles dispersed in a suspension medium, the fixed-abrasive particles being fixedly attached to the suspension medium;

dispensing the planarizing solution onto the fixed-abrasive pad;

pressing the surface of the substrate against the fixed-abrasive pad in the presence of the planarizing solution, wherein the planarizing solution forms non-soluble oxides on the surface of the substrate; and moving at least one of the substrate and the fixed-abrasive pad relative to the other, the fixed-abrasive pad removing the non-soluble oxides from the substrate.

5. A method for chemical-mechanical planarization of a metal surface of a microelectronic substrate, the method comprising:

forming a thin layer of non-soluble oxides on the surface of the substrate with an abrasive-free liquid solution having water and a second oxidant, the solution having a pH that oxidizes the metal surface without passing the metal into solution; and removing the layer of non-soluble oxides from the surface of the substrate with a fixed-abrasive particle polishing pad.

6. The method of claim 5 wherein the material at the surface of the substrate comprises a metal, and wherein the forming step comprises maintaining a pH of the planarizing solution not greater than approximately 5.0.

7. The method of claim 5 wherein the material at the surface of the substrate comprises tungsten, and wherein the forming step comprises maintaining a pH of the planarizing solution between approximately 4.0 and 5.0.

8. The method of claim 5 wherein the material at the surface of the substrate comprises aluminum, and wherein the forming step comprises maintaining a pH of the planarizing solution between approximately 3.0 and 10.0.

9. The method of claim 5 wherein the removing step comprises pressing the surface of the substrate against the fixed-abrasive pad in the presence of the liquid solution and moving at least one of the substrate and the fixed-abrasive pad relative to the other.

10. The method of claim 9 wherein the forming step comprises providing an abrasive-free planarizing solution having a chemical that oxidizes material at the surface of the substrate without passing the material into solution.

11. A method for chemical-mechanical planarization of a surface of a semiconductor wafer, the method comprising the steps of:

oxidizing material at the surface of the wafer with an abrasive-free liquid planarizing solution having deionized water and an oxidant, the solution being at a pH that oxidizes the surface material without dissolving the material; and removing a thin layer of non-soluble oxides from the surface of the wafer with a fixed-abrasive particle polishing pad.

12. The method of claim 11 wherein the material at the surface of the wafer comprises a metal, and wherein the oxidizing step comprises maintaining a pH of the planarizing solution not greater than approximately 5.0.

13. The method of claim 11 wherein the material at the surface of the wafer comprises tungsten, and wherein the oxidizing step comprises maintaining a pH of the planarizing solution between approximately 4.0 and 5.0.

14. The method of claim 11 wherein the material at the surface of the wafer comprises aluminum, and wherein the oxidizing step comprises maintaining a pH of the planarizing solution between 3.0 and 10.0.

15. A method of chemical-mechanical planarization of a surface of a substrate, the method comprising the steps of:

forming a thin layer of non-soluble oxides of a material at the surface of the substrate with a non-abrasive liquid planarizing solution having deionized water and an oxidant that oxidizes the material without dissolving the material; and abrading the non-soluble oxides with abrasive particles fixedly attached to a fixed-abrasive polishing pad, the abrasive particles removing the non-soluble oxides from the surface of the substrate.

16. The method of claim 15 wherein the material at the surface of the substrate comprises tungsten, and wherein the forming step comprises coating the surface of the substrate with a planarizing solution containing potassium iodate and having a pH between approximately 4.0 and 5.0.

17. The method of claim 15 wherein the material at the surface of the substrate comprises tungsten, and wherein the forming step comprises coating the surface of the wafer with a planarizing solution containing ferric nitrate and having a pH between approximately 4.0 and 5.0.

18. The method of claim 15 wherein the material at the surface of the substrate comprises tungsten, and wherein the forming step comprises coating the surface of the substrate with a planarizing solution containing bromine and having a pH between approximately 4.0 and 5.0.

19. The method of claim 15 wherein the material at the surface of the substrate comprises aluminum, and wherein the forming step comprises coating the surface of the substrate with a planarizing solution containing hydrogen peroxide and having a pH between approximately 3.0 and 10.0.

20. The method of claim 15 wherein the material at the surface of the substrate comprises aluminum, and wherein the forming step comprises coating the surface of the substrate with a planarizing solution containing potassium iodate and having a pH between approximately 3.0 and 10.0.

21. The method of claim 15 wherein the material at the surface of the substrate comprises aluminum, and wherein the forming step comprises coating the surface of the substrate with a planarizing solution containing ferric nitrate and having a pH between approximately 3.0 and 10.0.

22. A method of chemical-mechanical planarization of a surface of a semiconductor wafer, the method comprising the steps of:

forming a thin scabrous layer from material at the surface of the wafer with a planarizing solution having deionized water and an oxidant, the solution being at a pH such that the scabrous layer is non-soluble in the planarizing solution; and abrading the non-soluble scabrous layer with abrasive particles fixedly attached to a fixed-abrasive polishing pad, the abrasive particles removing the scabrous layer from the surface of the wafer.

23. The method of claim 22 wherein the material at the surface of the wafer comprises tungsten, and wherein forming the scabrous layer comprises coating the surface of the wafer with a planarizing solution containing potassium iodate and having a pH between approximately 4.0 and 5.0.

24. The method of claim 22 wherein the material at the surface of the wafer comprises tungsten, and wherein forming the scabrous layer comprises coating the surface of the wafer with a planarizing solution containing ferric nitrate and having a pH between approximately 4.0 and 5.0.

25. The method of claim 22 wherein the material at the surface of the wafer comprises tungsten, and wherein forming the scabrous layer comprises coating the surface of the wafer with a planarizing solution containing bromine and having a pH between approximately 4.0 and 5.0.

26. The method of claim 22 wherein the material at the surface of the wafer comprises tungsten, and wherein forming the scabrous layer comprises coating the surface of the wafer with a planarizing solution containing hydrogen peroxide and having a pH between approximately 3.0 and 10.0.

27. The method of claim 22 wherein the material at the surface of the wafer comprises aluminum, and wherein forming the scabrous layer comprises coating the surface of the wafer with a planarizing solution containing potassium iodate and having a pH between approximately 3.0 and 10.0.

28. The method of claim 22 wherein the material at the surface of the wafer comprises aluminum, and wherein forming the scabrous layer comprises coating the surface of the wafer with a planarizing solution containing ferric nitrate and having a pH between approximately 3.0 and 10.0.

29. The method of claim 22 wherein the abrading step comprises pressing the scabrous layer against the abrasive particle of the fixed-abrasive pad and moving at least one of the wafer and the fixed-abrasive pad with respect to the other.

30. A method for forming electrically isolated conductive features on a substrate with a fixed-abrasive polishing pad having abrasive particles fixedly bonded to a suspension medium, the method comprising:

depositing a layer of conductive material over an insulating layer on the substrate and into depressions in the insulating layer;

dispensing a substantially non-abrasive planarizing solution having deionized water and an oxidizing agent onto the fixed-abrasive pad, the planarizing solution having a pH that forms a thin, scabrous layer on the conductive layer without passing the conductive material into solution;

pressing the conductive layer against the fixed-abrasive pad and the planarizing solution; and moving at least one of the substrate and the fixed-abrasive pad relative to the other, the abrasive particles in the fixed-abrasive pad removing the scabrous layer from the conductive layer.

31. The method of claim 30 wherein the moving step is continued until the insulating layer is exposed electrically isolating the conductive material in the depressions of the insulating layer.

32. The method of claim 30 wherein the dispensing step comprises oxidizing the conductive material at the surface of the substrate without passing the material into solution.

33. The method of claim 32 wherein the conductive material comprises tungsten, and wherein the oxidizing step comprises coating the surface of the substrate with a planarizing solution containing at least one of potassium iodate, ferric nitrate, and hydrogen peroxide, and having a pH between approximately 4.0 and 5.0.

34. The method of claim 32 wherein the conductive material comprises aluminum, and wherein the oxidizing step comprises coating the surface of the substrate with a planarizing solution containing hydrogen peroxide, ferric nitrate, and potassium iodate, and having a pH between approximately 3.0 and 10.0.

35. A chemical-mechanical planarization method for removing material from a surface of a semiconductor wafer using a fixed-abrasive pad having abrasive particles bonded to a suspension medium, the method comprising:

providing an abrasive-free planarizing solution having deionized water and a chemical, the solution being at a pH that oxidizes the material at the surface without passing the material into solution;

dispensing the planarizing solution onto the fixed-abrasive pad, wherein the planarizing solution interacts with the material at the surface of the wafer to form a non-soluble scabrous layer on the surface of the wafer;

pressing the surface of the wafer against the fixed-abrasive pad in the presence of the planarizing solution; and moving at least one of the wafer and the fixed-abrasive pad relative to the other to remove the scabrous layer from the wafer.

36. The method of claim 35 wherein the pressing step comprises oxidizing the material at the surface of the wafer without passing the material into solution.

37. The method of claim 36 wherein the material at the surface of the wafer comprises tungsten, and wherein the oxidizing step comprises coating the surface of the wafer with a planarizing solution containing at least one of hydrogen peroxide, ferric nitrate, and potassium iodate, and having a pH between approximately 4.0 and 5.0.

38. The method of claim 36 wherein the material at the surface of the wafer comprises aluminum, and wherein the oxidizing step comprises coating the surface of the wafer with a planarizing solution containing at least one of hydrogen peroxide, ferric nitrate, and potassium iodate, and having a pH between approximately 3.0 and 10.0.

* * * * *